(12) United States Patent
Chen et al.

(10) Patent No.: US 11,374,403 B2
(45) Date of Patent: *Jun. 28, 2022

(54) SINGLE-GATE-OXIDE POWER INVERTER AND ELECTROSTATIC DISCHARGE PROTECTION CIRCUIT

(71) Applicant: Taiwan Semiconductor Manufacturing Co., Ltd., Hsin-Chu (TW)

(72) Inventors: Po-Hung Chen, Taipei (TW); Kuo-Ji Chen, Wu-Ku (TW); Shao-Yu Chou, Chu Pei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/180,345

(22) Filed: Feb. 19, 2021

(65) Prior Publication Data
US 2021/0175707 A1 Jun. 10, 2021

Related U.S. Application Data

(63) Continuation of application No. 16/143,315, filed on Sep. 26, 2018, now Pat. No. 10,931,103.
(Continued)

(51) Int. Cl.
*H02H 9/04* (2006.01)
*H03K 17/082* (2006.01)
*H01L 27/02* (2006.01)

(52) U.S. Cl.
CPC ......... *H02H 9/046* (2013.01); *H01L 27/0266* (2013.01); *H01L 27/0285* (2013.01); *H03K 17/0822* (2013.01)

(58) Field of Classification Search
CPC .......... H02H 9/04; H02H 9/045; H02H 9/046; H02H 27/0248; H01L 27/0266; H01L 27/0251; H01L 27/0285; H03K 17/0822
See application file for complete search history.

(56) References Cited

U.S. PATENT DOCUMENTS 6,130,557 A 10/2000 Drapkin
6,424,510 B1 7/2002 Ajit
(Continued)

*Primary Examiner* — Adolf D Berhane
(74) *Attorney, Agent, or Firm* — Duane Morris LLP

(57) ABSTRACT

An electrostatic discharge (ESD) circuit includes: a cascade of NMOS transistors including a first NMOS transistor operatively cascaded to a second NMOS transistor wherein the cascade of NMOS transistors is operatively coupled to a first bus that receives an ESD pulse signal; a first single-gate-oxide ESD control circuit coupled to the first NMOS transistor and configured to turn on the first NMOS transistor during an ESD event, the first single-gate-oxide control circuit coupled between the first bus at a first voltage and a first node at a second voltage, wherein the first voltage is higher than the second voltage; a second single-gate-oxide control circuit operatively coupled to the second NMOS transistor and configured to turn on the second NMOS transistor during an ESD event and to turn off the second NMOS transistor during a normal operation, wherein the second single-gate-oxide control circuit is coupled between the first node at the second voltage and a second bus at a ground voltage, wherein the second voltage is higher than the ground voltage; and a voltage divider circuit operatively coupled to the first bus at the first voltage and the second bus at the ground voltage, wherein the voltage divider circuit is operatively coupled to the first single-gate-oxide ESD control circuit and the second single-gate-oxide ESD control circuit at the first node.

20 Claims, 7 Drawing Sheets

Related U.S. Application Data

(60) Provisional application No. 62/564,835, filed on Sep. 28, 2017.

(56) References Cited

U.S. PATENT DOCUMENTS

| | | |
|---|---|---|
| 6,459,553 B1 | 10/2002 | Drapkin |
| 7,679,420 B1 | 3/2010 | Burkland |
| 7,808,754 B2 * | 10/2010 | Jang |
| 10,931,103 B2 * | 2/2021 | Chen ................ H03K 17/0822 |
| 2005/0275989 A1 | 12/2005 | Chen |
| 2008/0043389 A1 | 2/2008 | Fehle |
| 2013/0077195 A1 | 3/2013 | Stockinger |
| 2015/0249334 A1 | 9/2015 | Chen |
| 2017/0155243 A1 | 6/2017 | Tan |

\* cited by examiner

SINGLE-GATE-OXIDE POWER INVERTER AND ELECTROSTATIC DISCHARGE PROTECTION CIRCUIT

RELATED APPLICATION

This application is a continuation application of U.S. patent application Ser. No. 16/143,315, filed Sep. 26, 2018, which claims the benefit of and priority to U.S. Patent Provisional Application No. 62/564,835, filed on Sep. 28, 2017, the contents of each are incorporated herein.

BACKGROUND

There have been increasing needs for smaller devices (e.g., shorter channel length and gate oxide thickness) which can operate at a higher speed for high-density and high-performance integrated circuits. Continuous scaling down devices in core logical circuitries with decreased channel length and gate oxide thickness can also reduce the operating voltage and thus reduce the power consumption. Such core logical circuitries from advanced technologies often connect with conventional peripheral devices (e.g., I/O devices) that typically operate at higher voltages (e.g., 3.3 volt), which are supported by metal-oxide-semiconductor (MOS) transistors with longer channels (e.g., 0.35 micrometer) and thicker gate oxides (e.g. 7 nanometer) than that of the core devices. Voltage input signal from the I/O devices especially those from the preceding generations of technologies can cause damage to the core devices that can only operate at low voltages if no suitable voltage protection is incorporated.

To protect devices in core logical circuitries, some form of electrostatic discharge (ESD) protection is typically required to sink current from the ESD source to ground in order to decrease a voltage level applied to the core devices. As the variability of a semiconductor manufacturing process increases as the device dimensions continue to scale down, protection against ESD damages becomes more difficult. Traditionally, a combination of devices with two or more different gate thicknesses operating at different voltages, a so-called dual-gate- or multiple-gate-oxide technology, is used. However, since multiple gate thicknesses are used, this conventional technology requires separate sets of masks for different gate oxides, which represents a major technoeconomical disadvantage. Specifically, this conventional technology essentially increases the number of processing steps within a semiconductor manufacturing process, increases the cost of the integrated circuit fabricated, and finally may also decrease the production yield. Thus, there exists a need for a circuit that can be used at a lower supply voltage while also withstanding a higher input signal voltage from an input/output (I/O) device using a single-oxide technology to minimize the fabrication steps and reduce the cost.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION OF EXEMPLARY EMBODIMENTS

Figure 1:
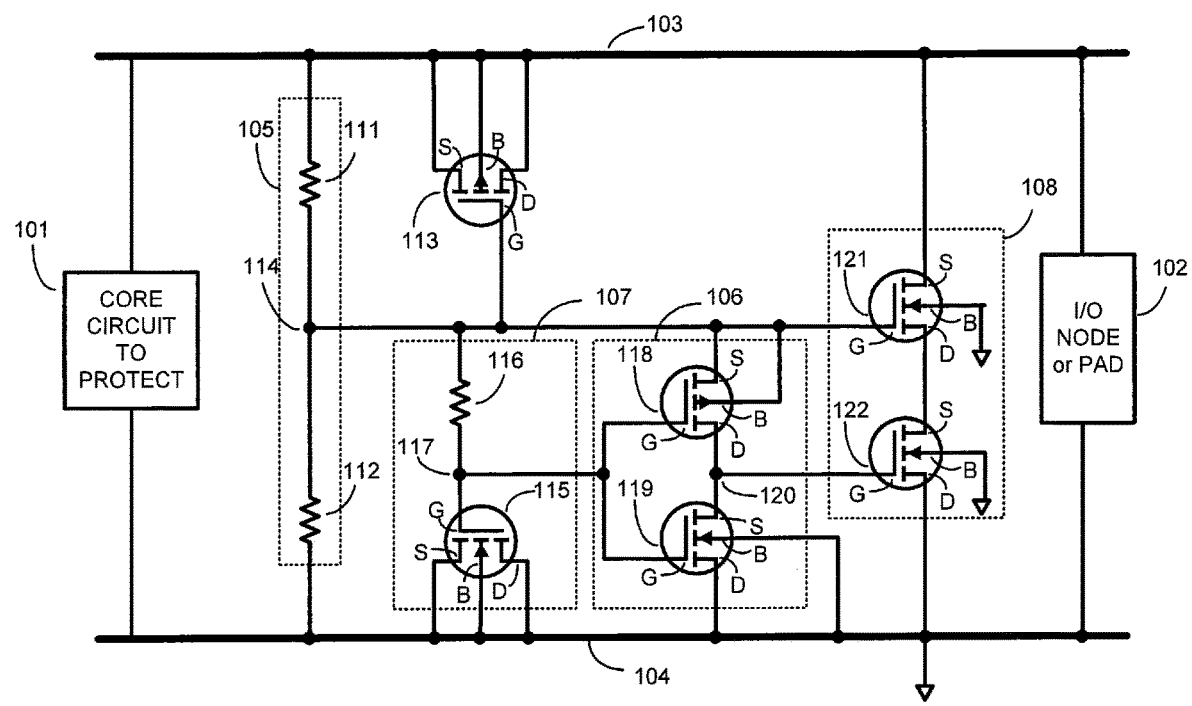
FIG. 1 illustrates an exemplary circuit diagram of an electrostatic discharge (ESD) protection circuit based on a single-gate-oxide technology, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The feature described herein may be embodied in different forms and are not to be constructed as being limited to the examples described herein. Rather, the examples described herein have been provided so that this disclosure will be thorough and complete, and will convey the full scope of the disclosure to one of ordinary skill in the art. Certain embodiments are not described in greater detail with reference to the accompanying drawings.

In the following description, the same drawing reference numerals are used for the same elements even in different drawings. The maters defined in the description, such as detailed construction and elements, are provided to assist in a comprehensive understanding of the preset examples. Accordingly, it is apparent that the embodiments are able to be carried out without those specifically defined matters. Also, well-known functions or constructions are not described in detail since they would obscure the embodiments with unnecessary detail.

While the expressions such as "first" or "second" are potentially used to refer to various elements, the elements are not to be limited by the expressions. The expressions are used only for the purpose of distinguishing one element from the other.

The expressions are used herein only for the purpose of explaining specific embodiments and not to be limiting. An expression in singular form encompasses plural meaning, unless otherwise specified. Throughout the description, the expression "comprise" or "have" is used only to designate the existence of a characteristic, number, step, operation, element, component or a combination thereof which are described herein, but not to preclude the possibility of existence of one or more of the other characteristics, numbers, steps, operations, elements, components or combinations of these or additional aspects.

The following description is merely exemplary in nature and is in no way intended to limit the disclosure, its application, or uses. For purposes of clarity, the same reference numbers are used in the drawings to identify similar elements. As used herein, the phrase at least one of A, B, and C is to be construed to mean a logical structure (A or B or C), using a non-exclusive logical or. It is also to be understood that steps within a method are potentially executed in a different order without altering the principles of the present examples.

This presented invention presents an electrostatic discharge circuit and a power switch circuit based on single-gate-oxide semiconductor devices that operates at low voltages to reduce fabrication processes and increase the production yield so as to reduce the production cost.

FIG. 1 illustrates an exemplary circuit diagram of an electrostatic discharge (ESD) protection circuit 100 based on a single-gate-oxide technology, in accordance with some embodiments of the present disclosure. The ESD protection circuit 100 (hereinafter "ESD circuit 100") includes a voltage divider circuit 105, a high-pass filter 106 (hereinafter "high-pass filter 106"), a single-gate-oxide ESD control circuit 107 (hereinafter "ESD control circuit 107"), and a bypass circuit 108, wherein the ESD control circuit 106 and the bypass circuit 108 are respectively coupled between a first bus 103 and a second bus 104.

A voltage divider circuit 105 includes a plurality of impedance elements connected in series serving as a voltage divider. Two resistors 111 and 112 connected in series are used in the voltage divider, in accordance with some embodiments. In some embodiments, an impedance element is a CMOS (complementary metal-oxide-semiconductor) diode connected with another CMOS diode. In some embodiments, an impedance element may be a suitable MOS transistor configured as a diode. In some embodiments, it could be a combination of various impedance elements.

A PMOS transistor 113 is configured as a p-channel MOS capacitor. To function as a MOS capacitor, the source (denoted as terminal "S" hereinafter), drain (denoted as terminal "D" hereinafter), and body (denoted as terminal "B" hereinafter) terminals of the PMOS transistor 113 are connected together to a power supply terminal, e.g., PHV, which is the first bus 103 and its gate terminal (denoted as terminal "G" hereinafter) connected to a node 114 which is at a lower voltage level than that on the first bus 103. Similarly, an NMOS transistor 115 is configured as an n-channel MOS capacitor with its terminals S, B, and D connected to the bus 104 which is GND and its terminal G connected to one end of a resistor 116 at the node 117 which is at a higher voltage level. The other end of the resistor 116 is connected to the terminal G of the transistor 113 at the node 114. In some embodiments, the same end of the resistor 116 connected to the terminal G of the transistor 115 is also connected to terminals G of two transistors including a PMOS transistor 118 and a NMOS transistor 119. The terminal D of the PMOS transistor 118 is also connected to the terminal S of the NMOS transistor 119 at a node 120. Terminals S and B of the PMOS transistor 118 are connected to the terminal G of the NMOS transistor 113 at the node 114, while the terminals B and D of the NMOS transistor 119 are connected to the second bus 104 which is connected to GND. As shown, the NMOS transistor 121 has its terminal S operatively coupled to the bus 103 that receives ESD voltage and PHV and has its terminal D operatively coupled to a terminal S of a cascaded NMOS transistor 122. The terminal D of the NMOS transistor 122 is connected to the second bus 104. The terminals G of the NMOS transistors 121 and 122 are further connected to nodes 114 and 120, respectively. It should be noted that additional components may be placed in between the first bus 103 and transistor 121.

During operation, when an ESD pulse is applied on the first bus 103 from a I/O node or pad 102, the high frequency pass filter formed by the resistor 116 and the NMOS transistor 115 functioning as a MOS capacitor would pull the voltage on the node 117 down to the voltage on the second bus 104 (e.g. GND). Similarly, the PMOS transistor 113 functioning as a MOS capacitor would also pull the voltage on the node 114 to the voltage on the first bus 103 (e.g. PHV). Since the voltage level at the node 114 is pulled up to PHV, the voltage difference between the node 114 and the second bus 104 and thus a voltage drop from the terminal G to the terminal B of the NMOS transistor 121 creates an electric field, which draws sparse electrons from the p-type substrate and concentrates them near the gate oxide layer. This charge redistribution induces a continuous n-type channel allows current to flow from the terminals S to D in the NMOS transistor 121. Thus, the NMOS transistor 121 is turned on. Since the voltage level at the node 117 is GND, which pulls the voltage on the terminal G of the PMOS transistor 140 to GND, the voltage difference between the node 114 and 117, thus a voltage drop from the terminal G to terminal B creates an electric field, which draws positively charged mobile charges in the n-type substrate and concentrates them near the oxide layer. This charge redistribution induces a continuous p-type channel and allows current to flow from the terminals S to D in the PMOS transistor 140. Thus, the PMOS transistor 140 is then turned on.

Simultaneously or subsequently, since there is no voltage difference between the terminals G and B on the NMOS transistor 119, the NMOS transistor 119 is turned off. The voltage level at the node 120 may be charged to the voltage on the node 114 (e.g., PHV). Since the voltage level at the node 120 is pulled to PHV, which pulls the voltage on the terminal G of the NMOS transistor 122 to PHV, the NMOS transistor 122 is then turned on because of the voltage difference between the terminals G and B in the NMOS transistor 122. Thus, the ESD pulse can be directed from the I/O node 102 to second bus 104, e.g, GND, through the two NMOS transistors 121 and 122 in the bypass circuit 108.

Simultaneously, when an ESD pulse is present on the first bus 103 together with the input voltage PHV (e.g., 1.8 V) from the I/O node 102, the voltage on the node 114 is controlled by the resistance values of the resistive elements 111 and 112 in the voltage divider circuit 105. In some embodiments, this voltage at the node 114 can be half of the voltage on the first bus 103 (PHV/2, e.g., 0.9 V), if the resistance values of the two resistors 111 and 112 are equal. As discussed above, the NMOS transistor 115 configured as a MOS capacitor, together with the resistive element 116, forms a high pass filter, which pulls the voltage at the node 117 to the voltage at the second bus 104, which is GND. Simultaneously or subsequently, since the voltage level at the node 117 is GND, the PMOS transistor 118 is turned on and the NMOS transistor 119 is turned off Since the PMOS transistor 118 is on and the NMOS transistor 119 is off, it pulls the voltage level at the node 120 to the voltage level at the node 114. The voltage applied on the terminal G of the NMOS transistor 121 is determined by the resistance values of the resistors 111 and 112 in the voltage divider circuit 110. In some embodiments, the voltage applied on the terminal G of the NMOS transistor 121 is half of the PHV, e.g., 0.9 V. Further, since the voltage level at the node 120 is half of the PHV, the NMOS transistor 122 is turned on. Thus, the ESD signal may be routed (e.g., discharged) through the NMOS transistor 121 and 122 (e.g., the bypass circuit 108) to GND (i.e., the bus 104) while the PHV can still be delivered to the core circuit 101.

Because of the use of the voltage divider circuit 105 in the ESD protection circuit, the maximum voltage between terminals G and S/D of all NMOS and PMOS transistors 115, 119, 121, 122, and 113, 118 is smaller than PHV. In some embodiments, if the PHV is 1.8 V, then the maximum voltage that can be applied to these active transistor devices including the NMOS transistors 130, 132, 133 and 134, and the PMOS transistor 140 is 0.9 V if the resistance values of the resistors 111 and 112 are equal. In some embodiments, the voltages on all NMOS and PMOS transistors can be different if the resistance values of the resistors 111 and 112 are different.

During normal operation, the NMOS transistor 113 and PMOS transistor 115, which are configured as MOS capacitors are turned off. The voltage at the node 117 is then pulled up to the voltage level at the node 114, which turns on the NMOS transistor 119 and turns off the PMOS transistor 118. Because of the voltage difference between the terminals G and B, the NMOS transistor 119 turns on and pulls the voltage at the node 120 down to GND, which then turns of the NMOS transistor 122. Thus, the voltage input of PHV from the I/O node 102 can be delivered to the core circuit 101.

The ESD circuit is made up preferably of only single-gate-oxide devices such that the NMOS and PMOS transistors 113, 115, 118, 119 121, and 122 all have the same gate oxide thickness. The resistive element 111 112 and 116 may be formed, for example on an integrated circuit by diffusion or they may be polysilicon resistors. In some embodiments, the thickness of the gate oxide can be thin (e.g., no more than 3 nanometers).

Figure 2:
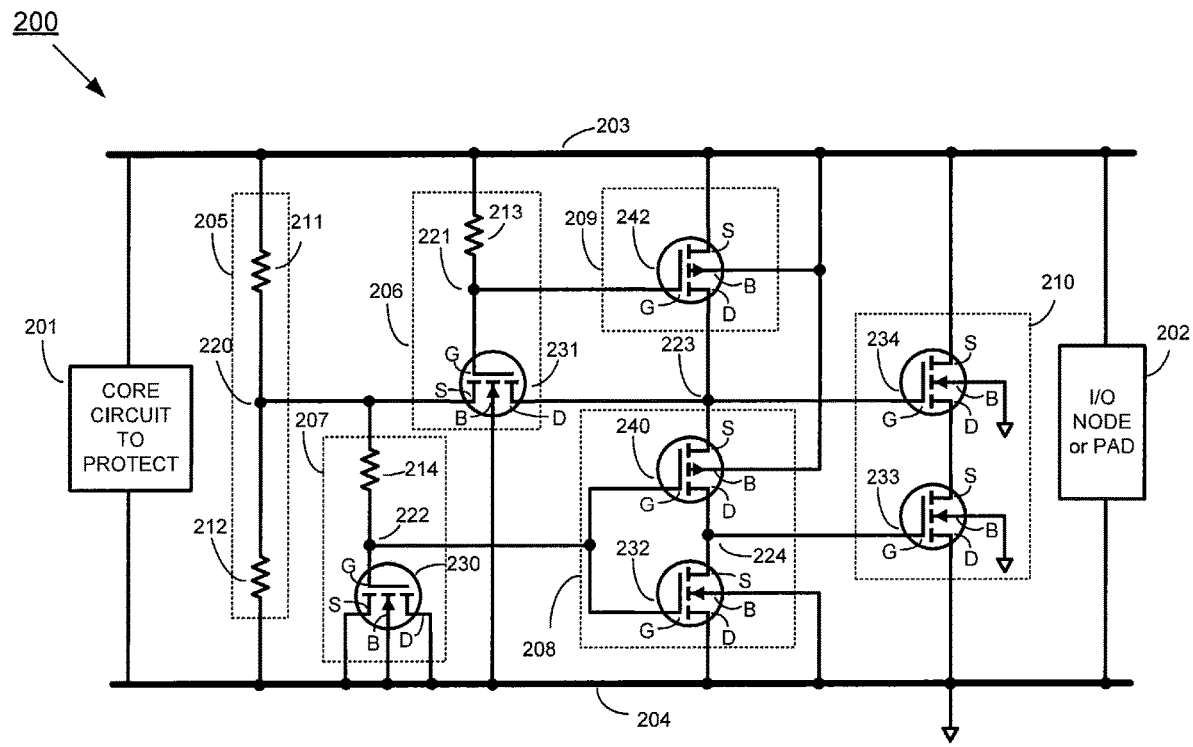
FIG. 2 illustrates an exemplary circuit diagram of an ESD protection circuit based on a single-gate-oxide technology, in accordance with some embodiments of the present disclosure.

FIG. 2 illustrates an exemplary circuit diagram of an ESD protection circuit 200 based on a single-gate-oxide technology, in accordance with some embodiments of the present disclosure. The ESD protection circuit includes a voltage divider circuit 205, two high-pass filter circuits 206 and 207, two ESD control circuit 208, and a bypass circuit 210. Each of the voltage divider circuit 205, the high-pass filter circuits 206 and 207, the ESD circuit 208, and the bypass circuit 209 will be respectively described below. In some embodiments, the voltage divider circuit 205 includes two resistors 211 and 212; the high-pass filter circuit 206 includes a resistor 213 and a transistor 231; the high-pass filter circuit 207 includes a resistor 214 and a transistor 230; the ESD control circuit include two transistors 232 and 240; and the bypass circuit 208 includes two transistors 233 and 234. In accordance with some embodiments of the present disclosure, the transistors 230, 231, 232, 233, and 234 may each be implemented as an n-type metal-oxide-semiconductor (NMOS) field-effect-transistor (FET). In some embodiments, the transistors 240 and 242 can each be implemented as a p-type metal-oxide-semiconductor (PMOS) filed-effect-transistor (FET). However, it is noted that the transistors 230, 231, 232, 233, 234, 240 and 242 may each be implemented as any of various types of transistors (e.g., a bipolar junction transistor (BJT), a high-electron mobility transistor (HEMT), etc.) while remaining within the scope of the present disclosure.

More specifically in the illustrated embodiment of FIG. 2, regarding the high-pass filter circuit 207, the resistor 214 has one end coupled to the node 220 and the other end coupled to the terminal "G" of the transistor 230. The transistor 230 includes four terminals S, D, G, and B. More specifically, in some embodiments, the terminal G of the transistor 230 is coupled to the resistor 214 at the node 222, and the terminals S, D, and B of the transistor 230 are respectively coupled to the second bus 204, which is GND. As such, the transistor 230 may function as an re-channel MOS capacitor, which will be described in further detail below.

When the ESD signal presents, the high-pass filter circuits 206 and 207 determine the presence of ESD signal and may cause the other parts of the circuit to response accordingly to enable the bypass circuit. Detailed operations of each of the ESD circuit under both the ESD and the normal operation modes, in accordance with some embodiments, are described below.

Each of the two high-pass filter circuits consists of a resistor and a NMOS transistor configured as a MOS capacitor. In some embodiments, the resistor 213 in the high-pass filter 206 has one end coupled to the terminals G of the NMOS transistor 231 and the PMOS transistor 242. The other end of the resistor 213 is coupled to the first bas 203 at a voltage level of PHV. In some embodiments, the resistor 214 in the high-pass filter 207 has one end coupled to the terminals G of the NMOS transistors 230, 232 and the PMOS transistor 240. The other end of the resistive element 214 is coupled to the node 220 at an intermediate voltage level determined by the voltage divider circuit 205.

During operation, when an ESD pulse is present on the first bus 203, the high frequency pass filter formed by the resistor 213 and the NMOS transistor 231 configured as a capacitor would pull the voltage on the node 221 down to a first voltage level. The first voltage level on the node 221 turns on the PMOS transistor 242. Simultaneously or subsequently, the voltage level at the node 223 may be charged to a second voltage level, which can turn on the NMOS transistor 234.

The high frequency pass filter 207 formed by the resistor 214 and the NMOS transistor 230 configured as a MOS capacitor would pull the voltage on the node 222 to a third voltage level. The third voltage level which is close to GND can turn off the NMOS transistor 232 and turn on the PMOS transistor 240, which pulls the voltage level at the node 224 to the voltage level at the node 223, e.g., the second voltage level, which can also turn on the NMOS transistor 234. Thus, the NMOS transistors 231 and 233 are turned on by the voltage difference between the terminals G and S/D in these transistors, which is smaller than 1 V to allow the proper operation of core transistor devices. The ESD signal can be routed (e.g., discharged) through the NMOS transistor 231 and 233 (e.g., the bypass circuit 208) to GND (i.e., the second bus 204), while the PHV can still be delivered from the I/O node 202 to the core circuit 201.

During normal operation, since the NMOS transistors 231 and 230, which are configured as MOS capacitors in the high-pass filter circuits 206 and 207, are turned off. The voltage level at the nodes 221 and 222 are pulled up to the voltage levels at the bus 203 (e.g., PHV) and the node 220 (e.g., an intermediate voltage level). In some embodiments, the voltage levels at the first bus 203 and the node 220 can be 1.8 V and 0.9 V, respectively. Simultaneously, since the voltage levels at the nodes 221 and 222 are pulled up, the two PMOS transistors 242 and 240 are turned off, and the NMOS transistor 232 is turned on. Since the NMOS transistor 232 is on, the voltage level at the node 224 is pulled down to GND. The voltage applied on the terminal G of the NMOS transistor 233 is GND, which turns off the NMOS transistor 233. Thus, the voltage input of PHV from the I/O node 202 can be delivered to the core circuit 201.

Because of the use of the voltage divider 205 and the high-pass filter circuits 206 and 207 in the ESD protection circuit, the maximum voltage level that can be applied to all the NMOS and PMOS transistors is 230, 231, 232, 233, 234, 240, and 242. In some embodiments, if the PHV is 1.8 V, then the maximum voltage that can be applied to these active transistors can be 0.9 V. Thus, the ESD circuit can be made up preferably of only single-gate-oxide devices such that the NMOS and PMOS transistors 230, 231, 232, 233, 234, 240, and 242 all have the same gate oxide thickness. The resistive element 211 and 212 may be formed, for example on an integrated circuit by diffusion or it may be a polysilicon resistor. In some embodiments, the thickness of the gate oxide can be thin (e.g., no more than 3 nanometers).

Figure 3:
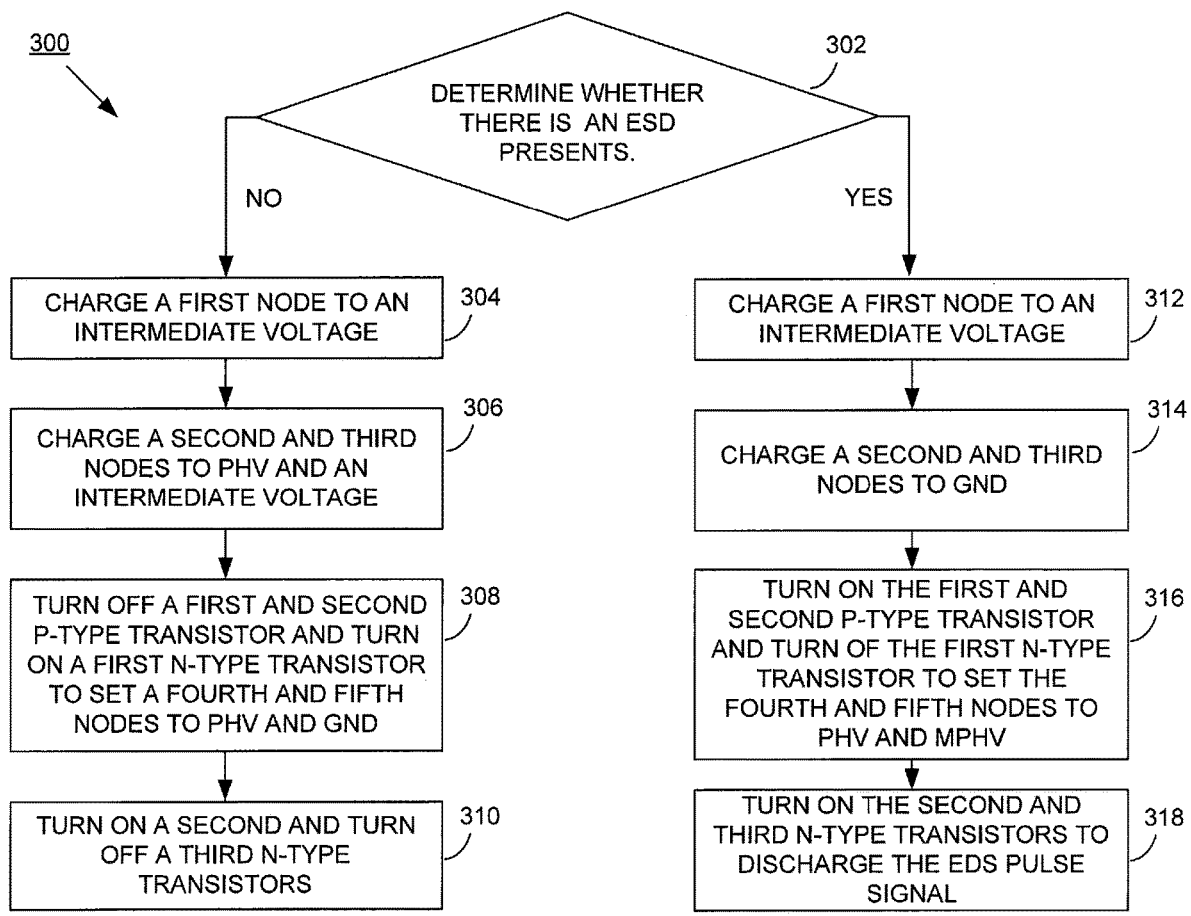
FIG. 3 is a bock diagram illustrating an operation of an ESD protection circuit based on a single-gate-oxide technology, in accordance with some embodiments of the present disclosure.

FIG. 3 illustrates an exemplary flow chart of a method 300 to operate an ESD circuit based on a single-gate-oxide technology, in accordance with some embodiments of the present disclosure. In some embodiments, the operations of the method 300 are performed by the respective components illustrated in FIGS. 1-2. For purposes of discussion, the following embodiment of the method 300 will be described in conjunction with FIG. 2. The illustrated embodiment of the method 300 is merely an example. Therefore, it should be understood that any of a variety of operations may be omitted, re-sequenced, and/or added while remaining within the scope of the present disclosure.

The method 300 starts with operation 302 in which a presence of an ESD event is detected by the ESD circuit 200, in accordance with various embodiments. In the above example of FIG. 2, the high-pass filter circuits 206 and 207 of the ESD circuit 200 is configured to detect whether an ESD pulse signal is present in the first bus 203. If no such ESD pulse signal is present, the method 300 proceeds to operations 304, 306 and 308. However, if an ESD pulse signal is present along with the PHV on the first bus 203, the method 300 proceeds to operations 310, 312, and 314. Both routes of the method 300 will be discussed below, respectively.

If no ESD pulse signal is detected at operation 302, the method 300 continues to operation 304 in which a first node of the ESD circuit 200 is set at an intermediate voltage level by a first and second resistors. In some embodiments, this intermediate voltage level (MHV) can be half of the voltage on the first bus 203, e.g., PHV/2, if the resistance values of the first and second resistors are equal.

The method 300 continues to operation 306 in which a second node of the ESD circuit 200 is charged to PHV through a third resistor and a third node of the ESD circuit 200 is charged to an intermediate level (e.g., MHV) through a fourth resistor of the ESD circuit 200, in accordance with some embodiments. More specifically, continuing with the above example, the second node, e.g., the node 221, may be charged through the resistor 213 (the third resistor) to a voltage level that is substantially close the PHV on the bus 203. The third node, e.g., the node 222, may be charged through the resistor 214 (the fourth resistor) to MHV that is determined by the first and second resistors.

The method 300 continues to operation 308 in which a first and a second p-type transistors are turned off, a first n-type transistor is turned on, and a fourth node is charged to the intermediate voltage level and a fifth node is charged to GND, in accordance with some embodiments. Still with the same example, since the node 221 is pulled to PHV and the node 222 is pulled to MHV, the transistors 242 (the first p-type transistor) and 240 (the second p-type transistor) are turned off, and the transistor 232 (the first n-type transistor) is turned on. Thus, the node 223 (the fourth node) is pulled to MHV and the node 224 (the fifth node) is pulled to GND.

The method 300 continues to operation 310 in which a second n-type transistor is turned on and a third n-type transistor is turned off, in accordance with some embodiments. Still with the same example, the transistor 234 (the second n-type transistor) is turned on and the transistor 233 (the third n-type transistor) is turned off. Accordingly, the PHV propagated on an I/O node or pad, e.g., 202, may be delivered to a core circuit, e.g., 201.

If an ESD pulse signal is detected together with an input voltage from the I/O node or pad, the method 300 continues to operation 312 in which the first node of the ESD circuit 200 is set at the intermediate voltage level by the first and second resistors. In some embodiments, this intermediate voltage level can be half of the voltage on the bus 203, e.g., MHV, if the resistance values of the first and second resistors are equal.

The method 300 continues to operation 314 in which the second and third nodes of the ESD circuit 200 are pulled down to GND, in accordance with some embodiments. More specifically, continuing with the above example, the second node, e.g., the node 221, may be charged to a voltage level that is substantially close the GND on the second bus 204. The third node, e.g., the node 222, may be charged close to a voltage level on the second bus 204, e.g., GND.

The method 300 continues to operation 316 in which the first and second p-type transistors are turned on, the first n-type transistor is turned off, and the fourth and fifth node is charged to PHV and MHV, in accordance with some embodiments. Still with the same example, since the nodes 221 is pulled to an intermediate level and 222 is pulled to a voltage level close to GND, the transistors 242 (the first p-type transistor) and 240 (the second p-type transistor) are both turned on, and the transistor 232 (the first n-type transistor) is turned off. Thus, the node 223 (the fourth node) is pulled to an intermediate voltage level and the node 224 (the fifth node) is pulled to a level smaller than the intermediate voltage level on the node 223.

The method 300 continues to operation 318 in which a second and the third n-type transistors are turned on, in accordance with some embodiments. Still with the same example, the transistor 234 (the second n-type transistor) and the transistor 233 (the third n-type transistor) are turned on by the voltage levels on the node 223 and 224. Accordingly, the PHV propagated on the I/O node or pad, e.g., 202, may be delivered to a core circuit, e.g., 201 while the ESD pulse signal is discharged through the second and third n-type transistors to GND.

Figure 4:
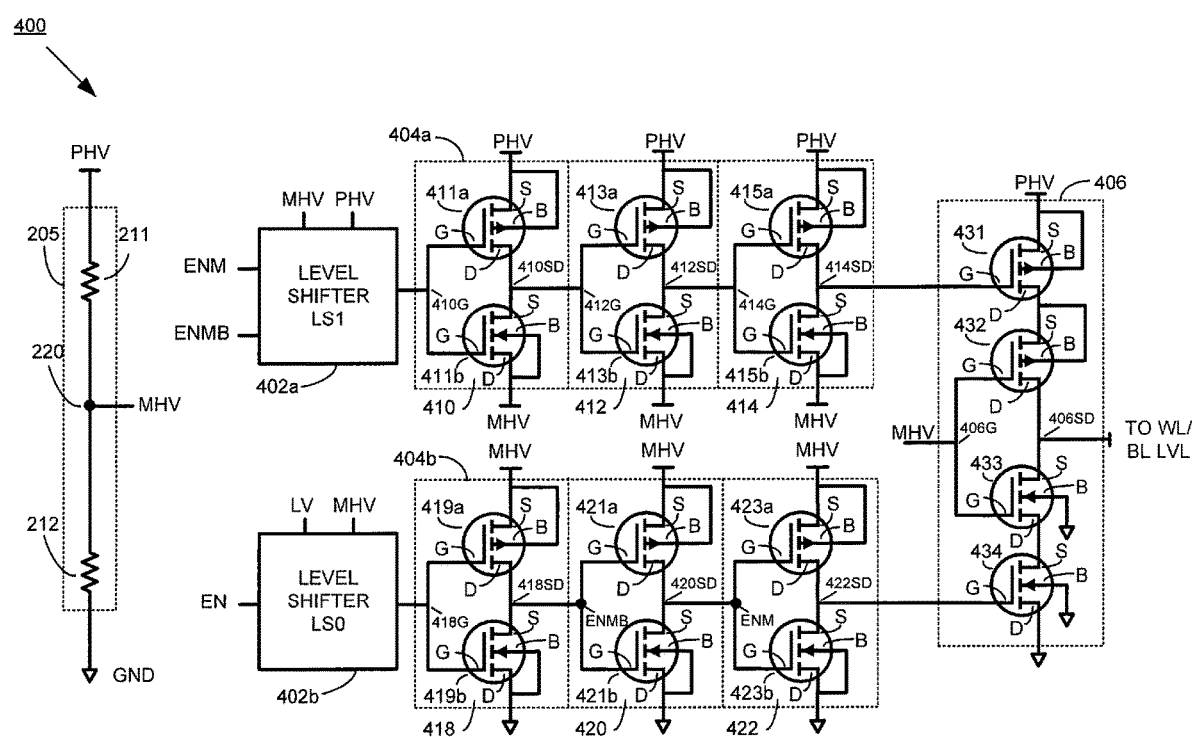
FIG. 4 is an exemplary circuit diagram illustrating a power switch circuit based on a single-gate-oxide technology, in accordance with some embodiments of the present disclosure.

FIG. 4 illustrates a circuit diagram of a single-gate-oxide power switch 400 based on a single-gate-oxide technology, in accordance with some embodiments of the present invention. The single-gate-oxide power switch 400 includes a voltage divider 205, two level shifter circuits 402a and 402b, two driver buffer circuits 404a and 404b, and an output buffer circuit 406. The first and second level shifter circuits 402a and 402b each includes 5 terminals: 2 power supply terminals, 2 input terminals and 1 output terminal. The first and second level shifter (LS) 402a and 402b operate at different input levels, wherein the first LS 402a works in MHV and PHV range and the second LS 402b works in LV (low voltage) and MHV range, in some embodiments. The connections and operation of the circuit are discussed further in detail in FIGS. 5 and 6.

The voltage divider 205 includes a plurality of impedance elements connected in series serving as a voltage divider. In the illustrated embodiment, the voltage divider 205 comprises 2 resistors 211 and 212 connected in series are used in the voltage divider, in accordance with some embodiments. The voltage divider 205 is to provide a MHV to the level shifter 402a/402b, driver buffer circuits 404a/404b, and output buffer circuit 406. For example, when a PHV of 1.8 V is applied, a MHV of 0.9 V can be obtained on the node 220.

The level shifter 402a operates in a voltage range of MHV to PHV and the level shifter 402b operates in a voltage range of LV to MHV. In some embodiments, the level shifter circuit 402a can shift a voltage from LV to MHV or from MHV to PHV. Configuration and operation of the level shifter 402a and 402b are discussed in detail in FIGS. 5 and 6 below.

The first and second driver buffer circuits 404a and 404b each includes 3 inverters. Specifically, the first driver buffer circuit 404a includes inverter circuits 410, 412, and 414, and the second driver buffer circuit 404b includes inverter circuits 418, 420, and 422. The 3 inverters in a driver buffer circuit 404 each consists of a PMOS transistor and a NMOS transistor that are connected together in series (e.g., a terminal D of the PMOS transistor is connected to a terminal S of the NMOS transistor). All the terminal S of the PMOS transistors (e.g., 411a, 413a, and 415a) of the first driver buffer circuit 404a are connected to PHV. All the terminals D of the NMOS transistors (e.g., 411b, 413b, and 415b) of the first driver buffer circuit 404a are connected to MHV from node 220 of the voltage divider 205. Further, terminals G of the two PMOS and NMOS transistors in an inverter circuit are connected together. Specifically, in a first inverter 410 of the first driver buffer circuit 404a, a node where a terminal S of a PMOS transistor 411a and a terminal D of a NMOS transistor 411b is connected is denoted as "410SD" hereinafter. A node where the terminals G of the PMOS transistor 411a and the NMOS transistor 411b are connected is denoted as "410G" hereinafter. Second, and third inverters 412, and 414 are also configured similarly to the first inverter 410. The 3 inverters in the driver buffer circuit are operationally coupled in series with the node 412G connected to the node 410SD, the node 414G connected to the node 412SD. Finally, the node 410G of the first inverter is connected to the output of the first level shifter 402a, and the node 414SD is connected to a terminal G of a PMOS transistor 431 in the output buffer 406.

The second driver buffer circuit 404b is configured similarly to the first driver buffer circuit 404a. The 3 inverters each consists a PMOS transistor and a NMOS transistor. All the terminal S of the PMOS transistors (e.g., 419a, 421a, and 423a) of the second driver buffer circuit 404b are connected to MHV. All the terminals D of the NMOS transistors (e.g., 419b, 421b, and 423b) of the second driver buffer circuit 404b are connected to GND. Nodes G of the respective inverters 420, and 422 are connected to nodes SD of the respective inverters 418, and 420. Finally, the node 418G of the first inverter 418 of the second driver buffer 404b is connected to an output terminal of the second level shifter 402b, and the node 422SD of the third inverter 422 in the second driver buffer 404b is connected to a terminal G of a NMOS transistor 434 in the output buffer 406. Further, the node 418SD from the second driver buffer circuit 404b is connected to the ENMB input of the first level shifter 402a and the node 420SD from the second driver buffer circuit 404b is coupled to the ENM of the first level shifter 402a.

The output buffer 406 comprises two PMOS transistors e.g., 431 and 432, and two NMOS transistors, e.g., 433 and 434 connected in series. Specifically, a terminal D of a first PMOS transistor 431 is connected to a terminal S of a second PMOS transistor 432. A terminal D of the second PMOS transistor 432 is connected to a terminal S of a first NMOS transistor 433. A terminal S of the first NMOS transistor 433 is then connected to a terminal S of a second NMOS transistor 434. A terminal S of the first PMOS transistor is connected to PHV, while a terminal D of the second NMOS transistor 434 is connected to GND. Further, terminals G of the second PMOS transistor 432 and the first NMOS transistor 433 are connected together, which is further connected to MHV. The terminal S of the second PMOS transistor 432 and the terminal D of the first NMOS transistor 433 are used as an output terminal of the power inverter circuit 400. The p-type substrate of the NMOS transistors 433 and 434 are tied to the GND voltage level and the n-type substrates of the PMOS transistors 431 and 432 are coupled to the terminal S of the respective transistors.

During operation, when a voltage level swinging between MHV and PHV at the output terminal of the first level shifter 402a is applied on the first driver buffer circuit 404a and a voltage level swinging between 0V and MHV at the output terminal of the second level shifter 402b is applied on the second driver buffer circuit 404b, the NMOS transistor 411b is turned on and the PMOS transistor 411a is turned off, which pulls the voltage at the node 410SD to GND. The voltage level of GND applied on the node 412G of the second inverter 412 turns on the PMOS transistor 413a and turns off the NMOS transistor 413b, which pulls the voltage at the node 412SD to PHV. The voltage level further gets inverted twice by the third and the fourth inverter, which then outputs a voltage level swinging from MHV to PHV at the node 416SD. Similarly, a voltage level swinging from 0 to MHV at the node 424SD can be achieved.

When two logical low voltages, MHV and 0V, are on the nodes 414SD and 422SD, respectively, the PMOS transistor 431 is therefore turned on to pull the voltage between the terminal D of the first PMOS transistor 431 and the terminal S of the second PMOS transistor 432 to PHV. Due to the MHV on the terminal D, the second PMOS transistor 432 can be therefore turned on to further pull the voltage between the terminal D of the second PMOS transistor 432 and the terminal S of the first NMOS transistor 433 to PHV. The second NMOS transistors 434 is turned off and the first NMOS transistor 433 is turned on. Thus, when the outputs of the level shifters 402a and 402b are at their logic high levels, the output at the node 406SD of the output buffer 406 is at its logic high level, e.g. PHV. Similarly, when the outputs of the level shifters 402a and 402b are at their logic low levels, the output at the node 406SD is at its logic low level, e.g., 0V.

This single-gate-oxide level shifter (LS) 402a is used to convert logic signals from a core circuit having an operating voltage swinging between 0V and MHV such as 0.9V to an I/O output terminal with higher voltage levels from 0V to PHV such as 1.8V, while keeping the voltage difference across its gate oxide below the breakdown voltage. Specifically, since the terminals B/S of PMOS transistors and terminals B/D NMOS transistors in the first driver buffer 404a are connected to PHV and MHV, respectively, the voltage difference between the terminals G and S/D of all the transistors are limited. Thus, all the PMOS and NMOS transistors in the first driver buffer 404a can be thin gate oxide devices. Similarly, voltage differences between the terminals G and S/D of two PMOS transistors in the output buffer 404 as well as on all the transistors in the second driver buffer 404b are also limited by the intermediate voltage. Thus, all the PMOS and NMOS transistors in the driver buffer 404 and output buffer 406 also can be thin gate oxide devices with the same oxide thickness. In some embodiments, the gate oxide can be no more than 3 nanometers in thickness. All the transistors also can be thick gate oxide devices to allow operation at higher voltages. In some other embodiments, the gate oxide can be no more than 7 nanometers in thickness.

Figure 5:
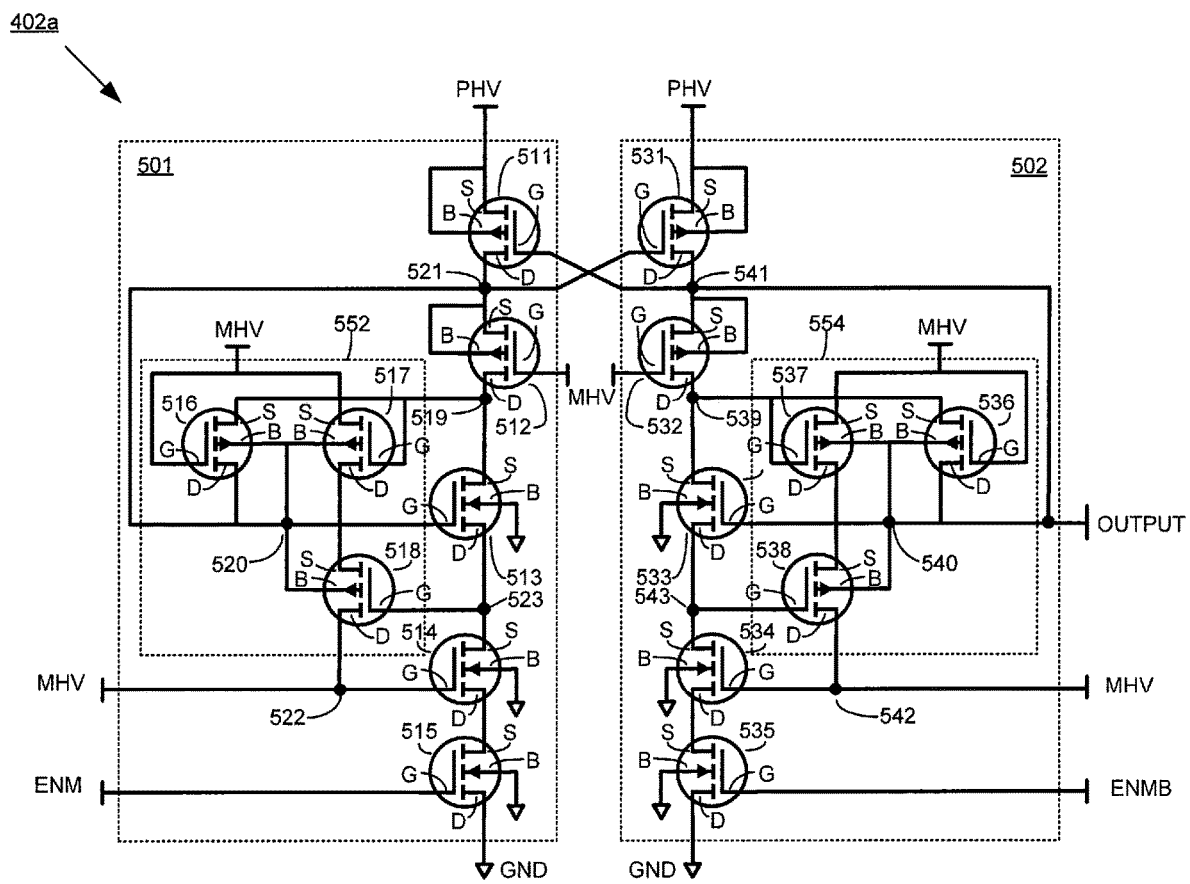
FIG. 5 is an exemplary circuit diagram illustrating a level shifter circuit based on based on a single-gate-oxide technology, in accordance with some embodiments of the present disclosure.

FIG. 5 illustrates a circuit diagram 402a of a first single-gate-oxide level shifter that interfaces a low voltage circuit with a high voltage circuit in the power switch circuit 400, in accordance with some embodiments of the present invention. The first single oxide level shifter 402a consists two identical circuit blocks 501 and 502. The two identical circuit blocks 501 and 502 each includes 5 PMOS transistors and 3 NMOS transistors.

In the first circuit block 501, a cascade of transistors including two of the PMOS transistors (511, and 512) and three of the NMOS transistors (513, 514, and 515) are connected in series through their terminals S and D. Specifically, the terminal D of a first PMOS transistors 511 is connected to the terminal S of a second PMOS transistor 512. The terminal D of the second PMOS transistor 512 is further connected to the terminal S of a first NMOS transistor 513. The terminal D of the first NMOS transistor 513 is connected to the terminal S of a second NMOS transistor 514. The terminal S of the second NMOS transistor 514 is connected to the terminal S of a third NMOS transistor 515. The terminal S of the first PMOS transistor 511 and the terminal D of the third NMOS transistor 515 are further connected to PHV and GND, respectively. The terminal G of the second PMOS transistor 512 is connected to MHV. The terminal G of the third NMOS transistor 515 is connected to the ENM as an input terminal. All the terminals B of the PMOS transistors are connected to their respective terminals S. All the terminals B of the NMOS transistors are connected to GND. The terminal S of a third PMOS transistor 516 is connected to the terminal G of a fourth PMOS transistor 517, which is further connected to the terminal D of the second PMOS transistor 512 and the terminal S of the first NMOS transistor 513 at a node 519. The terminal S of the third PMOS transistor 517 is connected to the terminal G of the fourth PMOS transistor 516, which is further connected to MHV. The terminals B of third and fourth PMOS transistors 516 and 517, the terminal D of the third PMOS transistor 516, and the terminal G of the first NMOS transistor 513 are connected together at a node 520. The node 520 is further connected to the terminal D of the first PMOS transistor 511 and the terminal S of the second PMOS transistor 512 at a node 521. The terminal S of a fifth PMOS transistor 518 is connected to the terminal D of the fourth PMOS transistor 517. The terminal B of the fifth PMOS transistor 518 is connected to the node 520. The terminal D of the fifth PMOS transistor 518 is connected to the terminal G of the second NMOS transistor 514 at a node 522, which is further connected to MHV. Finally, the terminal G of the fifth PMOS transistor 518 is connected to the terminal D of the first NMOS transistor 513 and the terminal S of the second NMOS transistor 514 at a node 523. The transistors 516, 517 and 518 in the first circuit block 501 of the level shifter circuit 500 are coupled together to perform as a voltage tracker 552 to protect the second NMOS transistor 514.

The construction of the second circuit block 502 in the level shifter circuit 500 is similar to that of the first circuit block 501. In the second circuit block 502, a cascade of transistors including two of the PMOS transistors and three of the NMOS transistors are connected in series through their terminals S and D. Specifically, the terminal D of a first PMOS transistors 531 is connected to the terminal S of a second PMOS transistor 532. The terminal D of the second PMOS transistor 532 is further connected to the terminal S of a first NMOS transistor 533. The terminal D of the first NMOS transistor 533 is connected to the terminal S of a second NMOS transistor 534. The terminal S of the second NMOS transistor 534 is connected to the terminal S of a third NMOS transistor 535. The terminal S of the first PMOS transistor 531 and the terminal D of the third NMOS transistor 535 are further connected to PHV and GND, respectively. The terminal G of the second PMOS transistor 532 is connected to MHV. The terminal G of the third NMOS transistor 535 is connected to the ENMB as an input terminal. All the terminals B of the PMOS transistors (e.g., 531 and 532) are connected to their respective terminals S. All the terminals B of the NMOS transistors (e.g., 533, 534 and 535) are connected to GND. The terminal S of a third PMOS transistor 536 is connected to the terminal G of a fourth PMOS transistor 537, which is further connected to the terminal D of the second PMOS transistor 532 and the terminal S of the first NMOS transistor 533 at a node 539. The terminal S of the third PMOS transistor 537 is connected to the terminal G of the fourth PMOS transistor 536, which is further connected to MHV. The terminals B of third and fourth PMOS transistors 536 and 537, the terminal D of the third PMOS transistor 536, and the terminal G of the first NMOS transistor 533 are connected together at a node 540. The node 540 is further connected to the terminal D of the first PMOS transistor 531 and the terminal S of the second PMOS transistor 532 at a node 541. The terminal S of a fifth PMOS transistor 538 is connected to the terminal D of the fourth PMOS transistor 537. The terminal B of the fifth PMOS transistor 538 is connected to the node 540. The terminal D of the fifth PMOS transistor 538 is connected to the terminal G of the second NMOS transistor 534 at a node 542, which is further connected to MHV. Finally, the terminal G of the fifth PMOS transistor 538 is connected to the terminal D of the first NMOS transistor 533 and the terminal S of the second NMOS transistor 534 at a node 543. The transistors 536, 537 and 538 in the second circuit block 502 of the level shifter circuit 500 are coupled together to perform as a voltage tracker 554 to protect the second NMOS transistor 534.

The two circuit blocks 501 and 502 are electrically coupled by connecting the node 521 in the first circuit block 501 to the terminal G of the first PMOS transistor 531 of the second circuit block 502 and connecting the node 541 in the second circuit block 502 to the terminal G of the first PMOS transistor 511 of the first circuit block 501. Finally, an output terminal is connected to the nodes 540 and 541.

During operation, the circuit block 501 receives input voltages at nodes ENM and ENMB from corresponding nodes (i.e., 418SD and 420SD) in the driver buffer circuit 404b with power supply voltages applied on nodes PHV and MHV as shown in the FIG. 5 and generate output voltage through the circuit 502 in predefined ranges. When a MHV=0.9 V and PHV=1.8 V, and when the ENM=0.9 V and ENMB=0 V are applied to the first level shifter circuit 402a, the transistor 514 and the transistor 515 are turned on, which pulls down the voltage level on the node 523 to GND. The transistor 512 is turned off. The low voltage level on the gate terminal of the transistor 518 turns on the transistor 518. The transistors 516 and 517 are then configured to set node 519 to GND. Similarly, the transistor 534 is turned on and the transistor 535 is turned off, which pulls up the voltage level on the node 543 to a high level. The transistor 536 and 537 are turned off, and the transistor 532 is turned on so as to pull the voltage level on the node 541 to high, which turns off the transistor 511 and turns on the transistor 531. Under this configuration, the voltage level on the output node equals to the voltage level on the node 540, which is 1.8 V. Similarly, when a MHV=0.9 V and PHV=1.8 V, and when the ENM=0 V and ENMB=0.9 V are applied to the first level shifter circuit 402a, the voltage level on the output node equals to the voltage level on the node 540, which is 0.9 V.

One advantage of the proposed single-gate-oxide level shifter is that its manufacturing costs are much lower than the traditional dual-gate-oxide level shifter. Another advantage of the proposed level shifter is that its switching speed can be improved because no thick gate oxide device is used.

Figure 6:
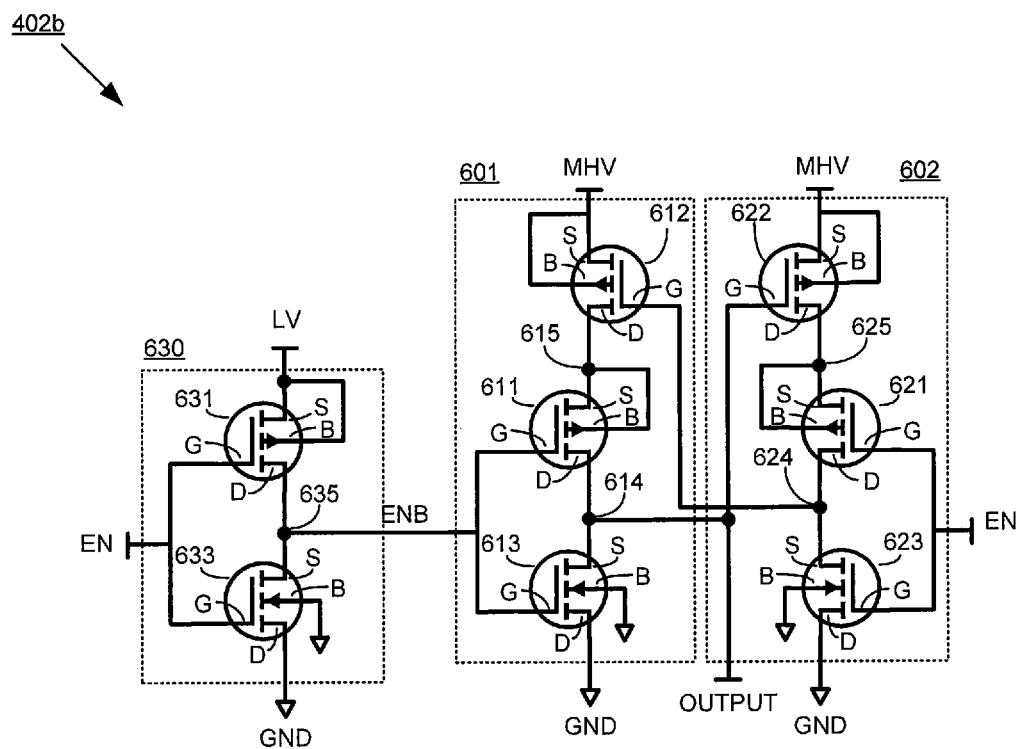
FIG. 6 is an exemplary circuit diagram illustrating a level shifter circuit based on a single-gate-oxide technology, in accordance with some embodiments of the present disclosure.

FIG. 6 illustrates a circuit diagram 402b of a second level shifter for interfacing a low voltage circuit with a high voltage circuit, in accordance with some embodiments of the present disclosure. The second level shifter circuit 402b of the power switch circuit 400 in FIG. 4 consists two identical circuit blocks 601 and 602, and an inverter 630. The inverter 630 comprises 1 NMOS transistor 633 and a PMOS transistor 631. Terminal D of the PMOS transistor 631 is coupled to the terminal S of the NMOS transistor 633, which is further coupled to the ENB node on the first circuit block 601, while terminal S of the PMOS transistor 631 is coupled to LV and the D terminal of the NMOS transistor 633 is coupled to GND. Terminals G of the NMOS transistor 633 and the PMOS transistor 631 are coupled together to EN.

Each of the two circuit blocks 601 and 602 includes 2 PMOS transistors and 1 NMOS transistor. Specifically, in the first circuit block 601 of the second level shifter circuit 402b, a first PMOS transistor 611 and an NMOS transistor 613 are connected in parallel by connecting the terminals G of the two transistors and also connecting the terminal D of the first PMOS transistor 611 and terminal S of the NMOS transistors 613 at a node 614. The terminals G of the transistors 611 and 613 are further connected to ENB as an input terminal. The terminal S of the first PMOS transistor 611 is further connected to the terminal D of the second PMOS transistor 612. The terminal S of the second PMOS transistor 612 is then connected to MHV. All the terminals B of the PMOS transistors 611 and 612 are connected to their respective terminals S and the terminal B of the NMOS transistor 613 is connected to GND.

The construction of the second circuit block 602 in the level shifter circuit 402b is similar to that of the first circuit block 601. In the second circuit block 602, a first PMOS transistor 621 and an NMOS transistor 623 are connected in parallel by connecting the terminals G of the two transistors and also connecting the terminal D of the first PMOS transistor 621 and terminal S of the NMOS transistors 623 at a node 624. The terminals G of the transistors 621 and 623 are further connected to EN as an input terminal. The terminal S of the first PMOS transistor 621 is further connected to the terminal D of the second PMOS transistor 622. The terminal S of the second PMOS transistor 622 is then connected to MHV. All the terminals B of the PMOS transistors 621 and 622 are connected to their respective terminals S and the terminal B of the NMOS transistor 623 is connected to GND.

The two circuit blocks 601 and 602 are electrically coupled by connecting the node 614 in the first circuit block 601 to the terminal G of the second PMOS transistor 622 of the second circuit block 602 and connecting the node 624 in the second circuit block 602 to the terminal G of the second PMOS transistor 612 of the first circuit block 601. Finally, an output terminal is connected to the nodes 614.

When MHV is applied on the input terminal ENB, the NMOS transistor 613 of the first circuit block 601 is turned on and the first PMOS transistor 612 of the first circuit block 601 is turned off, which then pulls the voltage at the node 614 to GND. Since the GND is applied on the terminal G of the first PMOS transistor 621 of the second circuit block 602, the first PMOS transistor 621 of the second circuit block 602 is turned on, which pulls the voltage at the node 625 to MHV. When GND is applied on the input terminal EN, the first PMOS transistor 621 of the second circuit block 602 is turned on and the NMOS transistor 623 of the second circuit block 602 is turned off. The voltage at the node 624 is then pulled up to the voltage level of MHV at the node 625. When MHV is applied on the input terminal EN, the NMOS transistor 623 of the second circuit block 602 is turned on and the first PMOS transistor 621 of the second circuit block 602 is turned off, which then pulls the voltage at the node 624 to GND. Since the GND is applied on the terminal G of the second PMOS transistor 611 of the first circuit block 601, the second PMOS transistor 611 is turned on, which pulls the voltage at the node 615 to MHV. When GND is applied on the input terminal EN, the second NMOS transistor 623 is turned off and the PMOS transistor 622 is turned on.

Similarly, When GND is applied on the input terminal ENB, the NMOS transistor 613 of the first circuit block 601 is turned off and the first PMOS transistor 612 of the first circuit block 601 is turned on, which then pulls the voltage at the node 614 to the voltage level at the node 615. When GND is applied on the input terminal EN, the first PMOS transistor 621 of the second circuit block 602 is turned on and the NMOS transistor 623 of the second circuit block 602 is turned off. The voltage at the node 624 is then pulled up to the voltage level at the node 625. When MHV is applied on the input terminal EN, the NMOS transistor 623 of the second circuit block 602 is turned on and the first PMOS transistor 621 of the second circuit block 602 is turned off, which then pulls the voltage at the node 624 to GND. Since the GND is applied on the terminal G of the second PMOS transistor 611 of the first circuit block 601, the second PMOS transistor 611 is turned on, which pulls the voltage at the node 615 to MHV. Since the first PMOS transistor 611 of the first circuit block 601 is on, the voltage level of MHV at the node 614 turns off the second PMOS transistor 622 in the second circuit block 602.

When an ENB=0 V and an EN=0.7 V are applied on the second level shifter 402b, the transistor 611 is turned on and transistor 613 is turned off, which pull the voltage level on the node 614 to 0.9 V. Similarly, the transistor 621 is turned off and transistor 623 is turned on, which pulls the voltage level on the node 624 to GND. The voltage levels on the nodes 614 and 624 turn on and off the transistors 612 and 614, respectively, which result in an output of 0.9 V on the node 614. Similarly, when an ENB=0.7 V and an EN=0 V are applied on the second level shifter 402b, the transistor 611 is turned off and the transistor 613 is turned on, which pulls the voltage level on the node 614 to GND, which results in an output of 0 V.

Figure 7:
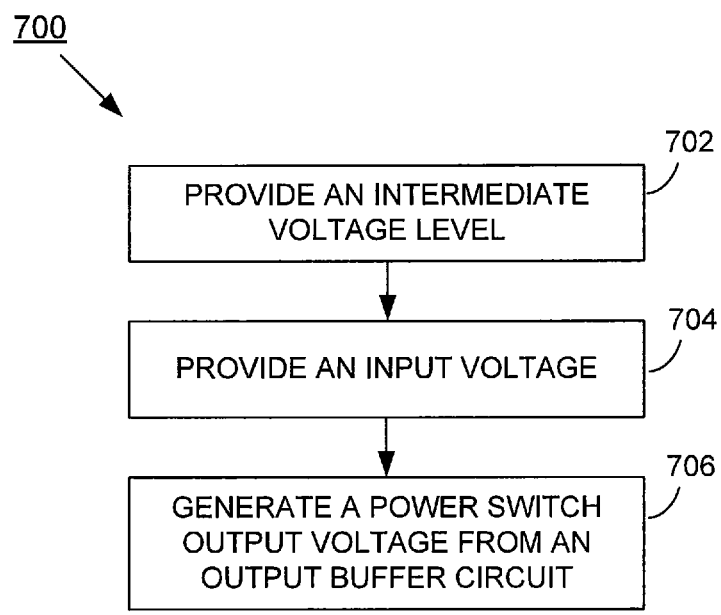
FIG. 7 is a block diagram illustrating a method to operate a power switch circuit based on a single-gate-oxide technology, in accordance with some embodiments of the present disclosure.

FIG. 7 illustrates a block diagram of a method 700 to operation a power switch circuit as shown in FIG. 4, in accordance with some embodiments of the present disclosure. It is understood that additional operations may be provided before, during, and after the method 700 of FIG. 7, and that some operations may be omitted or reordered.

The method 700 starts with operation 702, in which an intermediate voltage level is provided in accordance with some embodiments of the present disclosure. In some embodiments, the intermediate voltage level is provided by a voltage divider circuit. In some embodiments, the voltage divider 205 includes a plurality of impedance elements connected in series serving as a voltage divider. In the illustrated embodiment, the voltage divider 205 comprises 2 resistors 211 and 212 connected in series are used in the voltage divider, in accordance with some embodiments. The voltage divider 205 is to provide a MHV to the level shifter 402a/402b, driver buffer circuits 404a/404b, and output buffer circuit 406. For example, when a PHV of 1.8 V is applied, a MHV of 0.9 V can be obtained on the node 220.

The method 700 continues with operation 704, in which an input voltage is provided in accordance with some embodiments of the present disclosure. In some embodiments, the input voltage swinging in a voltage range of 0 to LV is provided on the second level shifter 402b which provides an output voltage to a driver buffer circuit 404b. In some embodiments the driver buffer circuit 404b operates in a voltage range of MHV and GND so as to provide a voltage output swinging between 0 and MHV. Two internal nodes in the second level shifter 402b are further coupled to the first level shifter 402a, which shifts the input voltage to a voltage range of MHV and PHV. The output of the first level shifter 402a is further coupled to a driver buffer circuit 404a which provides an output voltage swinging between MHV and PHV.

The method 700 continues with operation 706, in which two output voltages are provided to an output buffer circuit to provide a power switch output in accordance with some embodiments of the present disclosure. In some embodiments, the two output voltages applied on terminals G of two transistors (i.e., 431 and 434) in the output buffer circuit 406 to turn on and off the transistors when corresponding output voltage levels are provided. Terminals G of transistors 432 and 433 of the output buffer circuit 406 are coupled to MHV, keeping the voltage difference across its gate oxide below the breakdown voltage. When an EN of 0 V is applied, a 0 V is output from the power switch output and when an EN of LV (e.g., 0.7 V) is applied, a PHV of 1.8 V is output from the power switch output.

In an embodiment, an electrostatic discharge (ESD) circuit includes: a cascade of NMOS transistors including a first NMOS transistor operatively cascaded to a second NMOS transistor wherein the cascade of NMOS transistors is operatively coupled to a first bus that receives an ESD pulse signal; a first single-gate-oxide ESD control circuit coupled to the first NMOS transistor and configured to turn on the first NMOS transistor during an ESD event, the first single-gate-oxide control circuit coupled between the first bus at a first voltage and a first node at a second voltage, wherein the first voltage is higher than the second voltage; a second single-gate-oxide control circuit operatively coupled to the second NMOS transistor and configured to turn on the second NMOS transistor during an ESD event and to turn off the second NMOS transistor during a normal operation, wherein the second single-gate-oxide control circuit is coupled between the first node at the second voltage and a second bus at a ground voltage, wherein the second voltage is higher than the ground voltage; and a voltage divider circuit operatively coupled to the first bus at the first voltage and the second bus at the ground voltage, wherein the voltage divider circuit is operatively coupled to the first single-gate-oxide ESD control circuit and the second single-gate-oxide ESD control circuit at the first node.

In another embodiment, a method for controlling an electrostatic discharge (ESD) circuit with single-gate-oxide semiconductor devices, includes: detecting a ESD pulse signal by at least two high-pass filter circuits; charging a first node; charging a second node and a third node; and charging a fourth node and a fifth node to turn on a first NMOS transistor and a second NMOS transistor to discharge the ESD signal.

Yet, in another embodiment, a power switch circuit, includes: a voltage divider circuit operatively coupled to the first bus at the first voltage and the second bus at a second voltage, wherein the voltage divider circuit is operatively configured to provide a third voltage: at least two level shifter circuits, wherein a first level shifter circuit operates in a first supply voltage range of the second to the third voltage and a second level shifter circuit operates in a second supply voltage range of the third voltage to the first voltage; at least two driver buffer circuits coupled to the at least one corresponding level shifter circuit; and an output buffer circuit coupled to the at least two driver buffer circuits to provide a power switch output voltage, wherein the at least two level shifter circuits, the at least two driver buffer circuits and the output buffer circuits each comprises a plurality of single-gate-oxide devices.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An electrostatic discharge (ESD) circuit comprising:
a cascade of NMOS transistors including a first NMOS transistor operatively cascaded to a second NMOS transistor wherein the cascade of NMOS transistors is operatively coupled to a first bus that receives an ESD pulse signal;
a first single-gate-oxide ESD control circuit coupled to the first NMOS transistor and configured to turn on the first NMOS transistor during an ESD event, the first single-gate-oxide control circuit coupled between the first bus at a first voltage and a first node at a second voltage, wherein the first voltage is higher than the second voltage; and
a voltage divider circuit operatively coupled to the first bus at the first voltage and a second bus at a ground voltage, wherein the voltage divider circuit is operatively coupled to the first single-gate-oxide ESD control circuit.

2. The ESD circuit of claim 1, wherein the voltage divider circuit in the single-gate-oxide ESD comprises at least two resistors connected in series between the first bus that receives an electrostatic discharge and the second bus.

3. The ESD circuit of claim 1, wherein the first single-gate-oxide ESD control circuit comprises at least one single-gate-oxide device with a gate thickness of 3 nanometers or less.

4. The ESD circuit of claim 1, further comprising:
a second single-gate-oxide control circuit operatively coupled to the second NMOS transistor and configured to turn on the second NMOS transistor during an ESD event and to turn off the second NMOS transistor during a normal operation, wherein the second single-gate-oxide control circuit is coupled between the first node at the second voltage and the second bus at the ground voltage, wherein the second voltage is higher than the ground voltage, wherein the second single-gate-oxide ESD control circuit comprises an inverter circuit.

5. The ESD circuit of claim 4, wherein the second NMOS transistor is protected by the first NMOS transistor from the ESD event.

6. The ESD circuit of claim 4, further comprising:
two high-pass filter circuits operatively coupled to the first and second single-gate-oxide ESD control circuits, respectively, to set the first node to an intermediate voltage level and a third node to a low voltage level during an ESD event.

7. The ESD circuit of claim 6, wherein the two high-pass filter circuits each comprises a resistive component and a capacitive component.

8. The ESD circuit of claim 7, wherein the capacitive component in each of the two high-pass filter circuits can be a single-gate-oxide MOS device configured as a capacitor.

9. The ESD circuit of claim 7, wherein the resistive component in each of the two high-pass filter circuits sets the first voltages for the first and the second single-gate-oxide ESD control circuits.

10. A method for controlling an electrostatic discharge (ESD) circuit with single-gate-oxide semiconductor devices, comprising:
detecting a ESD pulse signal by at least two high-pass filter circuits;
charging a first node to an intermediate voltage level operatively controlled by a voltage divider circuit, wherein the voltage divider circuit comprises at least two resistors connected in series between a first bus and a second bus;
charging a second node and a third node; and
charging a fourth node and a fifth node to turn on a first NMOS transistor and a second NMOS transistor to discharge the ESD signal.

11. The method of claim 10, wherein the charging the second node is operatively controlled by a first high pass filter circuit.

12. The method of claim 11, wherein the charging the third node is operatively controlled by a second high pass filter circuit, wherein the first and second high-pass filter circuits each comprises a resistive component and a capacitive component, and wherein the capacitive component in each of the first and second high-pass filter circuits comprises a sing gate-oxide MOS device.

13. The method of claim 10, wherein the voltage divider circuit is operatively coupled to a first single-gate-oxide ESD control circuit and a second single-gate-oxide ESD control circuit at the first node.

14. The method of claim 10, wherein the charging the fourth node and the fifth node is operatively controlled by a first single-gate-oxide ESD control circuit and a second single-gate-oxide ESD control circuit.

15. The method of claim 14, wherein the first single-gate-oxide ESD control circuit and the second single-gate-oxide ESD control circuit each comprises a single-gate-oxide device with a gate thickness, wherein the thickness is equal to or smaller than 3 nanometers.

16. A power switch circuit, comprising:
a voltage divider circuit operatively coupled to the first bus at the first voltage and the second bus at a second voltage, wherein the voltage divider circuit is operatively configured to provide a third voltage;
at least two level shifter circuits, wherein a first level shifter circuit operates in a first supply voltage range of the second to the third voltage and a second level shifter circuit operates in a second supply voltage range of the third voltage to the first voltage; and
at least two driver buffer circuits coupled to a respective one of the at least two level shifter circuits;
wherein the at least two level shifter circuits, and the at least two driver buffer circuits each comprises a plurality of single-gate-oxide devices.

17. The power switch circuit of claim 16, wherein the voltage divider circuit comprises at least two resistors connected in series between the first bus and the second bus.

18. The power switch circuit of claim 16, wherein the at least two driver buffer circuit further comprises a plurality of inverters, wherein the plurality of inverters each operates in the same supply voltage range as the at least two level shifter circuits.

19. The power switch circuit of claim 16, wherein the plurality of single-gate-oxide devices have identical gate oxide thickness.

20. The power switch circuit of claim 16, wherein the first level shifter further comprises a voltage tracker.

* * * * *